(12) United States Patent
Masuda

(10) Patent No.: US 11,817,905 B2
(45) Date of Patent: Nov. 14, 2023

(54) OPTICAL TRANSCEIVER

(71) Applicant: NEC Corporation, Tokyo (JP)

(72) Inventor: Akira Masuda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 161 days.

(21) Appl. No.: 17/292,757

(22) PCT Filed: Nov. 6, 2019

(86) PCT No.: PCT/JP2019/043479
§ 371 (c)(1),
(2) Date: May 11, 2021

(87) PCT Pub. No.: WO2020/100685
PCT Pub. Date: May 22, 2020

(65) Prior Publication Data
US 2021/0399805 A1   Dec. 23, 2021

(30) Foreign Application Priority Data
Nov. 13, 2018   (JP) ................. 2018-213166

(51) Int. Cl.
*H04B 10/40* (2013.01)
*H01S 5/0239* (2021.01)
*G02B 6/42* (2006.01)

(52) U.S. Cl.
CPC .......... *H04B 10/40* (2013.01); *H01S 5/0239* (2021.01); *G02B 6/4246* (2013.01); *G02B 6/4268* (2013.01); *G02B 6/4281* (2013.01)

(58) Field of Classification Search
CPC .... H04B 10/40; G02B 6/4246; G02B 6/4268; G02B 6/4281; H01S 5/0239

USPC ......................................................... 398/135
See application file for complete search history.

(56) References Cited

U.S. PATENT DOCUMENTS

| 2009/0052898 | A1* | 2/2009 | Oki .................. H05K 1/189 398/79 |
| 2013/0121650 | A1* | 5/2013 | Mizobuchi .......... G02B 6/4215 385/89 |
| 2013/0156441 | A1 | 6/2013 | Kunii et al. |
| 2014/0284463 | A1* | 9/2014 | Kuroda ................. H04B 10/40 250/216 |

(Continued)

FOREIGN PATENT DOCUMENTS

| CN | 201584973 U | 9/2010 |
| CN | 204694888 U | 10/2015 |

(Continued)

OTHER PUBLICATIONS

International Search Report for PCT Application No. PCT/JP2019/043479, dated Jan. 21, 2020.

*Primary Examiner* — Dalzid E Singh

(57) ABSTRACT

An object is to provide an optical transceiver in which two single-core bidirectional optical communication devices are mounted on a single substrate. A first substrate includes an electric connector connected to an optical transmission apparatus, and a signal processing circuit processing electric signals that are input to and output from first and second optical transceiver modules. Components outputting a control signal to the signal processing circuit is mountd on a second substrate. A flexible printed circuit connects the first substrate to the first and second optical transceiver modules.

16 Claims, 15 Drawing Sheets

(56) References Cited

U.S. PATENT DOCUMENTS

| | | | | |
|---|---|---|---|---|
| 2015/0249503 A1* | 9/2015 | Sone | ................ | G02B 6/4261 |
| | | | | 398/135 |
| 2018/0041280 A1* | 2/2018 | Elahmadi | ........... | H04B 10/2569 |
| 2020/0073052 A1* | 3/2020 | Lin | ...................... | G02B 6/4254 |

FOREIGN PATENT DOCUMENTS

| JP | 2011-233837 A | 11/2011 |
|---|---|---|
| JP | 2013-128016 A | 6/2013 |

\* cited by examiner

OPTICAL TRANSCEIVER

This application is a National Stage Entry of PCT/JP2019/043479 filed on Nov. 6, 2019, which claims priority from Japanese Patent Application 2018-213166 filed on Nov. 13, 2018, the contents of all of which are incorporated herein by reference, in their entirety.

TECHNICAL FIELD

The present invention relates to an optical transceiver.

BACKGROUND ART

In an optical network, an optical transceiver having an optoelectric conversion function is disposed. As one of the optical transceivers, a pluggable optical transceiver configured to be insertable into and removable from an optical transmission apparatus (Host) is known.

To ensure compatibility with various types of optical transmission apparatuses (Hosts), the housing size of the pluggable optical transceiver and the arrangement of connectors to be connected with the optical transmission apparatus (Host) are specified as standards and specifications. Manufacturers of the pluggable optical transceivers need to mount necessary optical components and electric components in a limited space within a defined housing.

As an example of the pluggable optical transceiver, a pluggable optical transceiver for mounting a one-channel bidirectional optical transceiver device (BOSA: Bidirectional Optical Sub-Assembly) in a housing thereof has been proposed (PTL1). In this configuration, a wiring line for transmission/reception signals for one channel is disposed on a substrate, and the substrate and the BOSA are connected through a flexible printed circuit.

Also, a pluggable optical transceiver in which optical devices for two channels are mounted in a housing size defined by SFP (Small Form Factor Pluggable) has been proposed (PTL 2). In this configuration, two substrates respectively corresponding to the optical devices for the two channels are disposed. Each substrate is connected to an optical transmission apparatus (Host), and transmission/reception signals of each channel are transmitted on each substrate.

CITATION LIST

Patent Literature

[PTL 1] Japanese Unexamined Patent Application Publication No. 2013-128016
[PTL2] Japanese Unexamined Patent Application Publication No. 2011-233837

SUMMARY OF INVENTION

Technical Problem

In recent years, to achieve further miniaturization of the optical transceiver and high-density connection between the optical transceiver to the host, there has been a demand for a pluggable optical transceiver in which a single-core bidirectional optical communication device for two channels is mounted in a housing and connection terminals for transmitting and receiving signals for the two channels to and from the host is mounted on a single substrate. However, the pluggable optical transceivers proposed in PTLs 1 and 2 cannot satisfy these requirements.

An object of the present invention is to provide an optical transceiver in which two single-core bidirectional optical communication devices are mounted on a single substrate.

Solution to Problem

An aspect of the present invention is an optical transceiver including: a first optical transmission/reception module; a second optical transmission/reception module; a first substrate including an electric connector connected to an optical transmission apparatus and a signal processing circuit configured to process electric signals input to and output from the first and second optical transceiver modules; a second substrate on which a component outputting a control signal to the signal processing circuit is mounted; and a flexible printed circuit configured to connect the first substrate to the first and second optical transceiver modules.

Advantageous Effects of Invention

According to the present invention, it is possible to provide an optical transceiver in which two single-core bidirectional optical communication devices are mounted on a single substrate.

DESCRIPTION OF EMBODIMENTS

Figure 1:
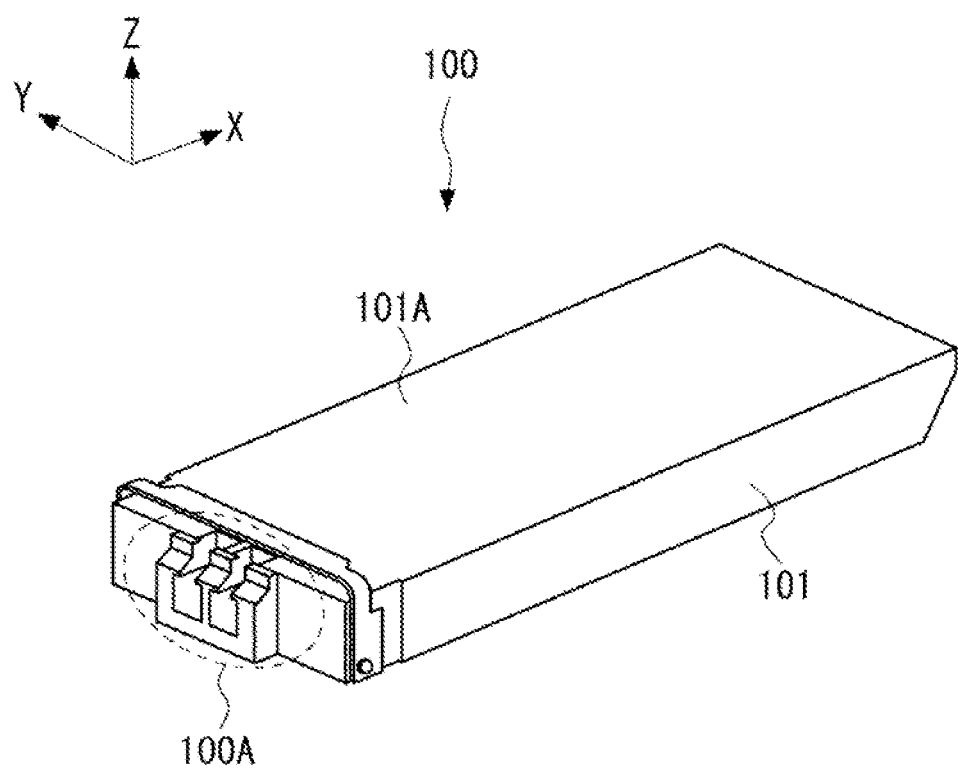
FIG. 1 is a perspective view of an optical transceiver according to a first example embodiment when viewed from an insertion side of an optical fiber.

Example embodiments of the present invention will be described below with reference to the drawings. In the drawings, the same elements are denoted by the same reference numerals, and thus a repeated description is omitted as needed.

First Example Embodiment

An optical transceiver 100 according to a first example embodiment will be described. The optical transceiver 100 is configured in such a manner that a connector connected to an optical fiber can be inserted thereinto and removed therefrom. The optical transceiver 100 can be inserted into and removed from an optical transmission apparatus such as a host, for example.

an appearance of the optical transceiver 100 will be described. FIG. 1 is a perspective view of the optical transceiver 100 according to the first example embodiment when viewed from an insertion side of an optical fiber. Referring to FIG. 1, a reference numeral 101A denotes an upper surface of a housing 101 of the optical transceiver 100. In FIG. 1, a reference numeral 100A denotes an insertion port of a connector of an optical fiber. In the optical transceiver 100, the upper surface 101A is configured as a removable cover.

Figure 2:
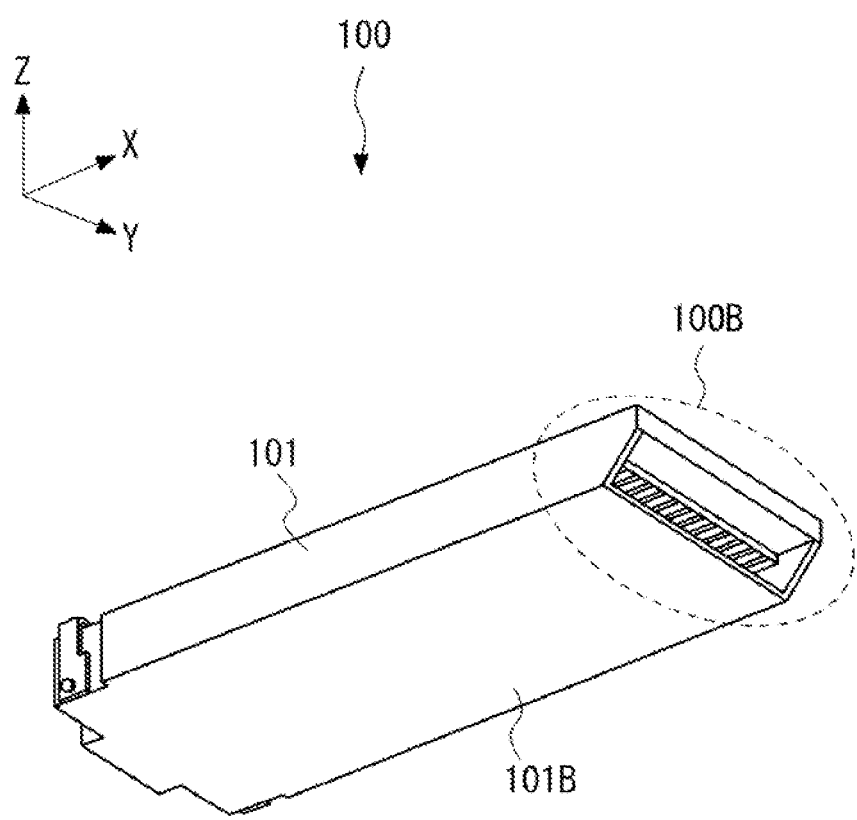
FIG. 2 is a perspective view of the optical transceiver according to the first example embodiment when viewed from an optical transmission apparatus side.

FIG. 2 is a perspective view of the optical transceiver 100 according to the first example embodiment when viewed from an optical transmission apparatus side. In FIG. 2, a reference numeral 101B denotes a lower surface of the housing 101 of the optical transceiver 100. In FIG. 2, a reference numeral 100B denotes a connection part (Electric Connector) with the optical transmission apparatus.

Figure 3:
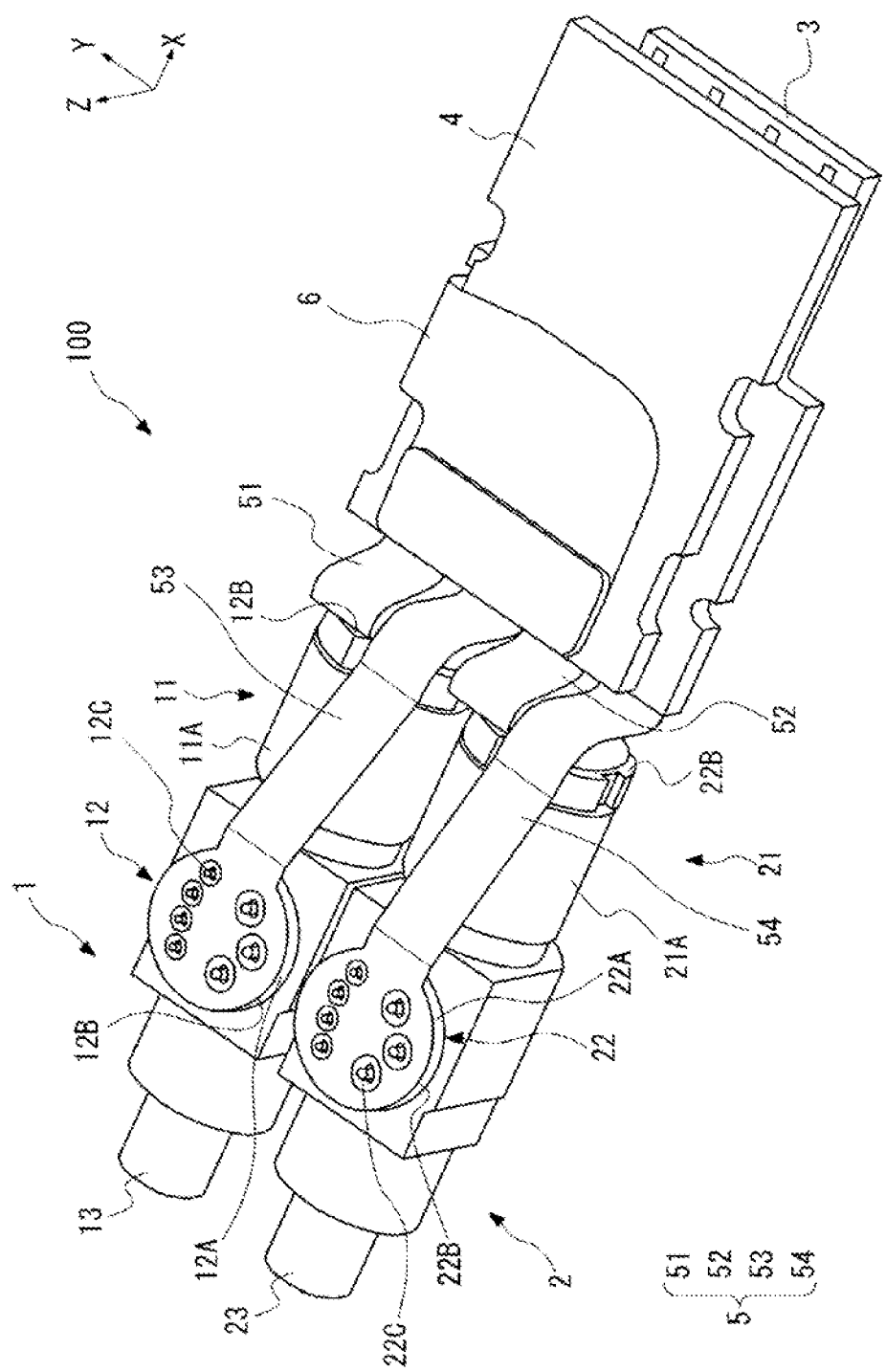
FIG. 3 is a diagram schematically showing an internal configuration of a housing of the optical transceiver according to the first example embodiment.

In the optical transceiver 100, necessary components such as an optical component, a substrate, and wiring lines are mounted in a housing 101. Hereinafter, an internal configuration of the optical transceiver 100 will be described. FIG. 3 schematically shows the internal configuration of the housing of the optical transceiver 100. In FIG. 3, the housing 101 is omitted to clearly show the internal configuration.

The optical transceiver 100 includes a BOSA 1, a BOSA 2, substrates 3 and 4, and flexible printed circuits 5 and 6 in the housing 101. The BOSA (Bidirectional Optical Sub-Assembly) is configured as a single-core bidirectional optical transceiver module or optical transceiver device.

The substrate 3 (First substrate) is a plate-like member whose principal plane is an X-Y plane of FIG. 3, and at least a signal processing circuit and wiring lines (Printed wiring lines) are disposed on both surfaces (Upper surface 3A on Z (+) side and Lower surface 3B on Z (−) side). One end of the substrate 3 is connected to the BOSA 1 (First optical transceiver module) and the BOSA 2 (Second optical transceiver module) by the flexible printed circuit 5. On the upper surface 3A of the substrate 3, signal processing circuits 31 and 32 are mounted. connector terminals are disposed at the other end of the substrate 3 to be capable of connecting to an external optical transmission apparatus (Host). Thus, the BOSA 1 and the BOSA 2 can communicate a transmission signal and a reception signal through the wiring lines formed on the substrate 3.

The signal processing circuit 31 is configured as a driver circuit for performing signal processing for the BOSA 1 (i.e., One channel). That is, the signal processing circuit 31 drives the BOSA 1 in response to a signal received from the optical transmission apparatus, and the BOSA 1 outputs an optical signal. The signal processing circuit 31 can demodulate a received signal output from the BOSA 1 and output the demodulated signal to the optical transmission apparatus.

Similarly, the signal processing circuit 32 is configured as a driver circuit for performing signal processing for the BOSA 2 (i.e., The other channel). That is, the signal processing circuit 32 drives the BOSA 2 in response to a signal received from the optical transmission apparatus, and the BOSA 2 outputs an optical signal. The signal processing circuit 32 can demodulate a received signal output from the BOSA 2 and output the demodulated signal to the optical transmission apparatus.

The substrate 4 (Second substrate) is a plate-like member whose principal plane is the X-Y plane of FIG. 3, and various components and wiring lines not mounted on the substrate 3 are formed on both surfaces (Upper surface 3A on Z (+) side and Lower surface 3B on Z (−) side). The substrate 3 and the substrate 4 are connected by flexible printed circuit 6, for example. The components mounted on the substrate 4 can communicate control signals with the signal processing circuits 31 and 32 through the flexible printed circuit 6. A control circuit controlling an operation of one or both of the BOSA 1 and the BOSA 2 may be disposed on the substrate 4. In this case, the control circuit disposed on the substrate 4 may output a control signal for controlling the BOSA 1 to the BOSA 1 through the flexible printed circuit 6, the wiring line disposed on the substrate 3, the signal processing circuit 31, the transmission wiring line 51, and the reception wiring line 53. The BOSA 1 may output a signal indicating an operation state of the BOSA 1 to the control circuit disposed on the substrate 4 through the transmission wiring line 51, the reception wiring line 53, the signal processing circuit 31, the wiring line disposed on the substrate 3, and the flexible printed circuit 6. The control circuit disposed on the substrate 4 may output a control signal for controlling the BOSA 2 to the BOSA 2 through the flexible printed circuit 6, the wiring line disposed on the substrate 3, the signal processing circuit 32, the transmission wiring line 52, and the reception wiring line 54. The BOSA 2 may output a signal indicating an operation state of the BOSA 2 to the control circuit disposed on the substrate 4 through the transmission wiring line 52, the reception wiring line 54, the signal processing circuit 32, the wiring line disposed on the substrate 3, and the flexible printed circuit 6.

In the present configuration, the substrate 3 and the substrate 4 are mounted in the housing 101 to be stacked in a direction (Z-direction, Second direction) normal to the principal plane (X-Y plane).

BOSAs 1 and 2 include a transmission unit in which a light-emitting element (e.g., Laser diode) outputting an optical signal to an optical fiber is mounted and a reception unit in which a light-receiving element (e.g., Photodiode) receiving an optical signal input from the optical fiber is mounted. In this example, for example, the transmission unit is configured as a CAN package in which a Laser diode is mounted, and the reception unit is configured as a CAN package in which a photodiode is mounted.

The BOSA 1 includes a transmission unit 11, a reception unit 12, and a connector unit 13. The connector unit 13 is configured to be connectable with an optical fiber.

The transmission unit 11 is mounted so that an optical axis of an optical signal output therefrom faces a longitudinal direction (X-direction, First direction) of the housing 101. From a bottom surface 11B of a case 11A (Stem in CAN package) of the transmission unit 11 parallel to a Y-Z plane, one or more transmission terminals 11C project in the longitudinal direction (X-direction) of the housing 101.

The reception unit 12 is mounted so that an optical axis of a received optical signal faces a direction (Z-direction) orthogonal to the longitudinal direction (X-direction) of the housing 101. From a bottom surface 12B of a case 12A (Stem in CAN package) of the reception unit 12 parallel to the X-Y plane, one or more reception terminals 12C project in a Z-direction.

The BOSA 2 includes the same configuration as that of the BOSA 1. The BOSA 2 includes a transmission unit 21, a reception unit 22, and a connector unit 23. The transmission unit 21, the reception unit 22, and the connector unit 23 correspond to the transmission unit 11, the reception unit 12, and the connector unit 13 of the BOSA 1, respectively. The connector unit 23 is configured to be connectable with an optical fiber.

The transmission unit 21 is mounted so that an optical axis of an optical signal output therefrom faces the longitudinal direction (X-direction) of the housing 101. From a bottom surface 21B of a case 21A (Stem in CAN package) of the transmission unit 21 parallel to the Y-Z plane, one or more transmission terminals 21C project in the longitudinal direction (X-direction) of the housing 101.

The reception unit 22 is mounted so that an optical axis of a received optical signal faces a direction (Z-direction) orthogonal to the longitudinal direction (X-direction) of the housing 101. From a bottom surface 22B of a case 22A (Stem in CAN package) of the reception unit 22 parallel to the X-Y plane, one or more reception terminals 22C project in the Z-direction.

BOSAs 1 and 2 are connected to the substrate 3 by the flexible printed circuit 5. The flexible printed circuit 5 includes transmission wiring lines 51 and 52, and reception wiring lines 53 and 54.

One end of the transmission wiring line 51 (First transmission wiring line) is connected to an end of the upper surface 3A of the substrate 3, and the other end is connected to the transmission terminal 11C of the transmission unit 11 of the BOSA 1. The transmission wiring line 51 is a strip-shaped flexible printed circuit and is mounted so that a principal plane thereof is parallel to a Y-direction (Third Direction). In this example, the transmission wiring line 51 is bent upward (Z-direction) to house an extra length thereof, and is mounted at an end connected to the transmission terminal 11C on the side of the transmission wiring line 51 so that the principal plane thereof is parallel to the bottom surface 11B (Y-Z plane).

One end of the transmission wiring line 52 (Second transmission wiring line) is connected to the end of the upper surface 3A of the substrate 3, and the other end is connected to the transmission terminal 21C of the transmission unit 21 of the BOSA 2. The transmission wiring line 52 is a strip-shaped flexible printed circuit and is mounted so that a principal plane thereof is parallel to the Y-direction. In this example, the transmission wiring line 52 is bent upward (Z-direction) to house an extra length thereof, and is mounted at an end connected to the transmission terminal 21C on the side of the transmission wiring line 52 so that the principal plane thereof is parallel to the bottom surface 21B (Y-Z plane).

The reception wiring line 53 (First reception wiring line) has one end connected to an end of the lower surface 3B of the substrate 3 and extends from the substrate 3 toward the reception terminal 12C of the reception unit 12 of the BOSA 1. The reception wiring line 53 is a strip-shaped flexible printed circuit, and is mounted at the end of the reception wiring line 53 side connected to the reception terminal 12C so that the principal plane thereof is parallel to the bottom surface 12B (X-Y plane).

The reception wiring line 54 (Second reception wiring line) has one end connected to the end of the lower surface 3B of the substrate 3 and extends from the substrate 3 toward the reception terminal 22C of the reception unit 22 of the BOSA 2. The reception wiring line 54 is a strip-shaped flexible printed circuit, and is mounted at the end of the reception wiring line 54 side connected to the reception terminal 22C so that the principal plane thereof is parallel to the bottom surface 22B (X-Y plane).

The flexible printed circuit 5 (i.e., Transmission wiring lines 51 and 52, and Reception wiring lines 53 and 54) may be configured as a flexible substrate having only a layer that is easily bent, or may be configured as a rigid-flexible substrate in which a rigid substrate having high rigidity is disposed at a connection part between the BOSA and the substrate.

The connection between the substrate 3 and the flexible printed circuit 5 is not particularly limited. For example, the end of the flexible printed circuit 5 configured as the rigid-flexible substrate may be directly connected to the end of the wiring line disposed on the substrate 3. The wiring line disposed on the substrate 3 may be connected to the flexible printed circuit 5 by fitting a connector disposed at the end of the wiring line disposed on the substrate 3 with a connector disposed at the end of the flexible printed circuit 5. The wiring line disposed on the substrate 3 may be connected to the flexible printed circuit 5 by various connecting methods such as pressure welding, fusion bonding, insertion of a conductive sheet, bonding, or the like.

As described above, since the reception units 12 and 22 are mounted with the Z-direction as the axis, the bottom surfaces 12B and 22B are in proximity to the housing 101. Further, since the reception terminal projects toward the housing, it is necessary to ensure insulation between the reception terminal and the housing 101.

For example, it is conceivable to reduce the thickness of the plate-like member 102 so that the plate-like member 102 does not contact the reception terminal which is a projection of the BOSA 1 and 2. In this case, the strength of the plate-like member 102 is reduced, which is disadvantageous in ensuring the mechanical strength of the optical transceiver 100.

Figure 4:
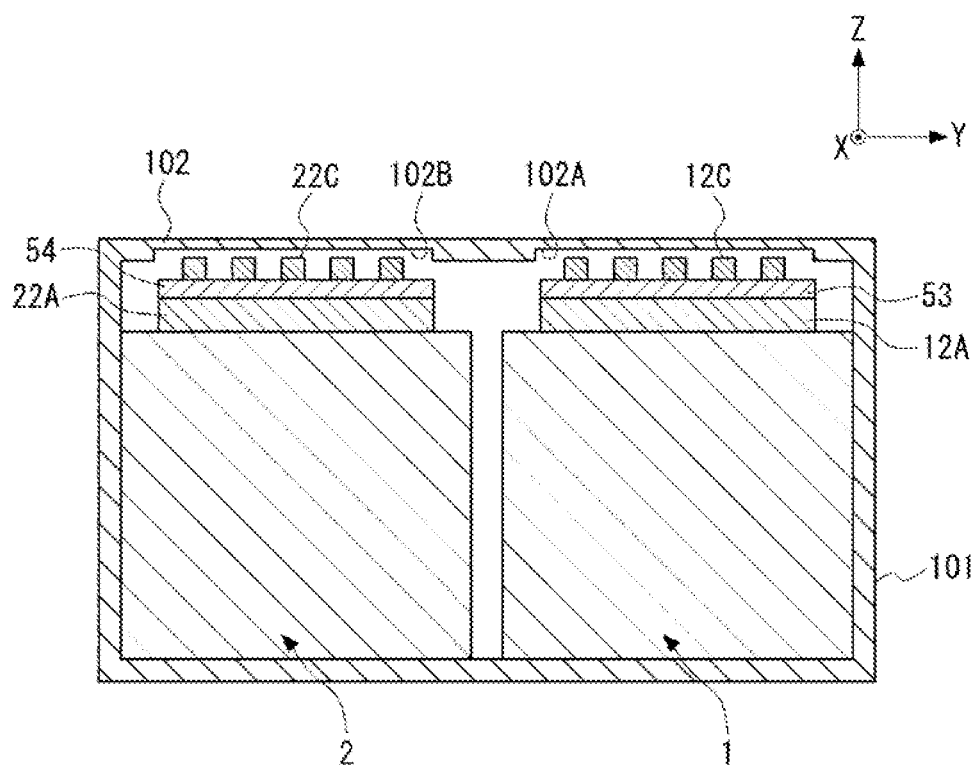
FIG. 4 is a cross-sectional view of a BOSA in a Y-Z plane.

On the other hand, in the present configuration, a housing part is disposed for preventing contact between the projections of the BOSAs 1 and 2, and the plate-like member 102 while ensuring the thickness of the plate-like member 102. FIG. 4 is a cross-sectional view of the BOSAs 1 and 2 in the Y-Z plane. To simplify the drawing, the internal configurations of the BOSAs 1 and 2 are not shown. As shown in FIG. 4, the upper surface of the housing 101 (Z (+)-side surface)

is configured as a plate-like member 102. On an inner surface (Bottom surface, or Z(−)-side) of the plate-like member, recesses for housing the projections of BOSA 1 and BOSA 2 are disposed as housing parts 102A and 102B. Thus, by disposing the housing parts 102A and 102B, it is possible to ensure the insulation while ensuring the strength of most of the plate-like member 102.

The projection of the BOSA 1 is housed in the housing part 102A disposed above (Z(+)-direction) without contacting the plate-like member 102. The projection of the BOSA 2 is housed in the housing part 102B disposed above (Z(+)-direction) without contacting the plate-like member 102. As a result, a gap is formed between the reception terminal and the plate-like member 102, and the insulation between the reception terminal and the plate-like member can be ensured.

Figure 5:
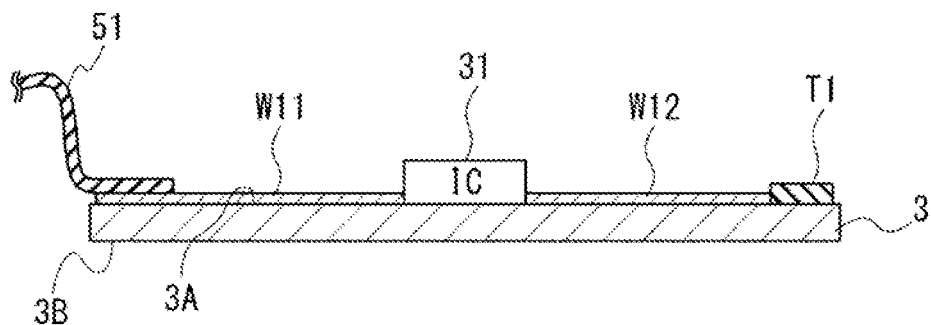
FIG. 5 is a diagram schematically showing configurations of a transmission wiring line connected to the BOSA and a wiring line disposed on a substrate connected to a connector terminal corresponding to the transmission wiring line.

Next, the wiring lines in the substrate 3 will be described. FIG. 5 schematically shows configurations of the transmission wiring line 51 connected to the BOSA 1 and a wiring line disposed on the substrate 3 connected to a connector terminal corresponding to the transmission wiring line 51. The transmission wiring line 51 and the signal processing circuit 31 are connected by a wiring line W11 disposed on the upper surface 3A of the substrate 3. A connector terminal T1 corresponding to the transmission using the BOSA 1, that is, the transmission wiring line 51 is disposed on the upper surface 3A of the substrate 3. The signal processing circuit 31 and the connector terminal T1 are connected by a wiring line W12 disposed on the upper surface 3A of the substrate 3.

Figure 6:
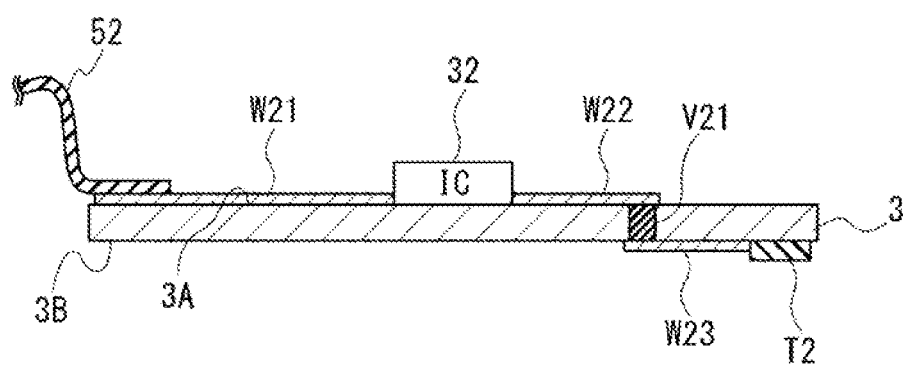
FIG. 6 is a diagram schematically showing configurations of a transmission wiring line connected to the BOSA and a wiring line disposed on the substrate connected to a connector terminal corresponding to the transmission wiring line.

FIG. 6 schematically shows configurations of the transmission wiring line 52 connected to the BOSA 2 and a wiring line disposed on the substrate 3 connected to a connector terminal corresponding to the transmission wiring line 52. The transmission wiring line 52 and the signal processing circuit 32 are connected by a wiring line W21 disposed on the upper surface 3A of the substrate 3. A connector terminal T2 corresponding to the transmission using the BOSA 2, that is, the transmission wiring line 52 is disposed on the lower surface 3B of the substrate 3. The signal processing circuit 32 and the connector terminal T2 are connected through a wiring line W22 disposed on the upper surface 3A of the substrate 3, a via hole V21 (First via hole) penetrating the substrate 3, and a wiring line W23 disposed on the lower surface 3B of the substrate 3. In other words, the signal processing circuit 32 and the upper end of the via hole V21 (End on Z(+)-side) are connected by the wiring line W22 disposed on the upper surface 3A of the substrate 3. The lower end of the via hole V21 (End on Z(−)-side) and the connector terminal T2 are connected by the wiring line W23 disposed on the lower surface 3B of the substrate 3.

Figure 7:
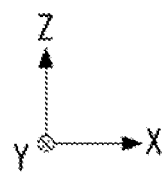
FIG. 7 is a diagram schematically showing configurations of a reception wiring line connected to the BOSA and a wiring line disposed on the substrate connected to a connector terminal corresponding to the reception wiring line.
Figure 7:
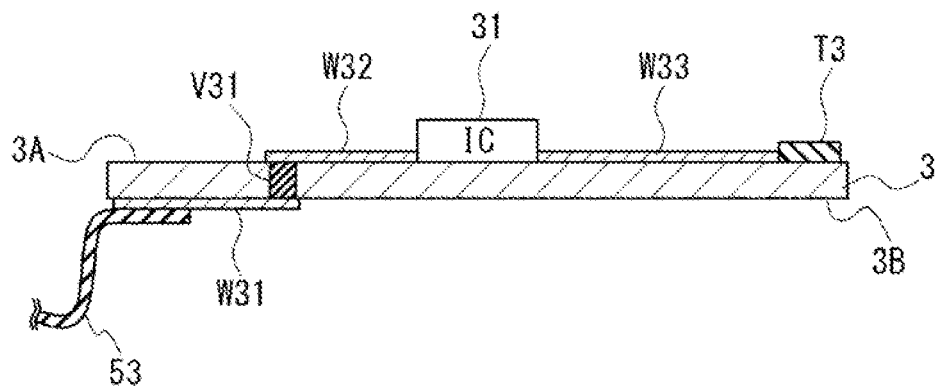

FIG. 7 schematically shows configurations of the reception wiring line 53 connected to the BOSA 1 and a wiring line disposed on the substrate 3 connected to a corresponding connector terminal corresponding to the reception wiring line 53. The reception wiring line 53 and the signal processing circuit 31 are connected by a wiring line W31 disposed on the lower surface 3B of the substrate 3, a via hole V31 (Second via hole) penetrating the substrate 3, and a wiring line W32 disposed on the upper surface 3A of the substrate 3. In other words, the reception wiring line 53 and the lower end of the via hole V31 (End on Z(−)-side) are connected by the wiring line W31 disposed on the lower surface 3B of the substrate 3. The upper end of the via hole V31 (End Z(+)-side) and the signal processing circuit 31 are connected by the wiring line W32 disposed on the upper surface 3A of the substrate 3. A connector terminal T3 corresponding to the reception using the BOSA 1, that is, the reception wiring line 53 is disposed on the upper surface 3A of the substrate 3. The signal processing circuit 32 and the connector terminal T3 are connected by a wiring line W33 disposed on the upper surface 3A of the substrate 3.

Figure 8:
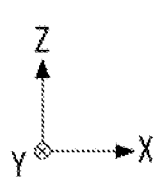
FIG. 8 is a diagram schematically showing a configuration of a reception wiring line connected to the BOSA and a wiring line disposed on the substrate connected to a connector terminal corresponding to the reception wiring line.
Figure 8:
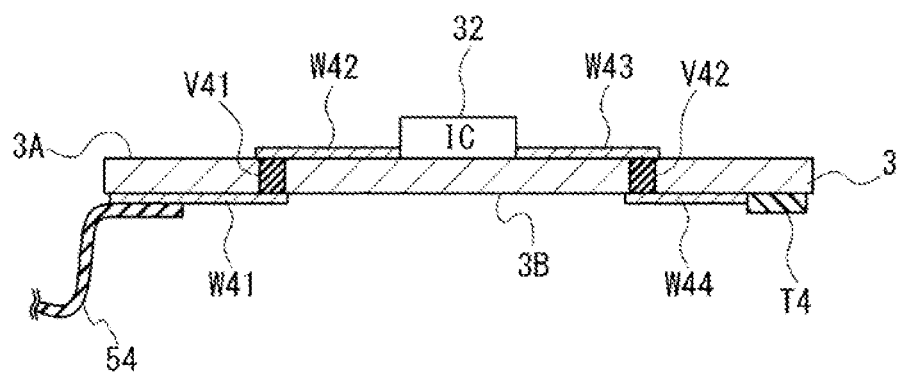

FIG. 8 schematically shows configurations of the reception wiring line 54 connected to the BOSA 2 and a wiring line disposed on the substrate 3 connected to a connector terminal corresponding to the reception wiring line 54. The reception wiring line 54 and the signal processing circuit 32 are connected through a wiring line W41 disposed on the lower surface 3B of the substrate 3, a via hole V41 (Third via hole) penetrating the substrate 3, and a wiring line W42 disposed on the upper surface 3A of the substrate 3. In other words, the reception wiring line 54 and the lower end of the via hole V41 (End on Z(−)-side) are connected by the wiring line W41 disposed on the lower surface 3B of the substrate 3. The upper end of the via hole V41 (End on Z(+)-side) and the signal processing circuit 32 are connected by the wiring line W42 disposed on the upper surface 3A of the substrate 3. A connector terminal T4 corresponding to the reception using the BOSA 2, that is, the reception wiring line 54 is disposed on the lower surface 3B of the substrate 3. The signal processing circuit 32 and the connector terminal T4 are connected through a wiring line W43 disposed on the upper surface 3A of the substrate 3, a via hole V42 (Fourth via hole) penetrating the substrate 3, and a wiring line W44 disposed on the lower surface 3B of the substrate 3. In other words, the signal processing circuit 32 and the upper end of the via hole V42 (End on Z(+)-side) are connected by the wiring line W43 disposed on the upper surface 3A of the substrate 3. The lower end of the via hole V42 (End on Z(−)-side) and the connector terminal T4 are connected by the wiring line W44 disposed on the lower surface 3B of the substrate 3.

In FIGS. 5 to 8, although the path of the wiring line is clearly indicated, and it does not mean that the wiring line is formed linearly in the X-direction, and it should be appreciated that the wiring line may be bent in the X-Y plane as appropriate.

As shown in FIGS. 5 to 8, by disposing the wiring lines on the substrate 3, signals for the transmission and reception of the BOSA 1 are transmitted to and received from an optical transmission apparatus that is the host through the connector terminals T1 and T3 disposed on the upper surface 3A of the substrate 3. Signals for the transmission and reception of the BOSA 2 are transmitted to and received from the optical transmission apparatus that is the host through the connector terminals T2 and T4 disposed on the lower surface 3B of the substrate 3.

It should be appreciated that the connector terminals T1 to T4 constitute an electric connector connected to the optical transmission apparatus.

Thus, even when two BOSAs are mounted in one optical transceiver, the connector terminals connected to the optical transmission apparatus are disposed on the upper surface and the lower surface of the substrate 3 for each BOSA (Per channel), so that the transmission and reception for each BOSA (Per channel) can be achieved.

Further, by disposing the connector terminals on both sides of the substrate 3, the surface area of the substrate 3 can be efficiently utilized. As a result, since the dimension of the substrate 3 in the Y-direction can be reduced, the optical transceiver including the two BOSAs can be miniaturized.

Note that the configuration described with reference to FIGS. 5 to 8 is merely an example. That is, the arrangement of the connector terminals is not limited to the arrangement in which the connector terminals connected to the optical transmission apparatus are arranged on the upper surface and the lower surface of the substrate 3 for each BOSA (Per channel), and the arrangement of the connector terminals may be appropriately changed. For example, the connector terminals corresponding to the transmission wiring lines 51 and 52 (i.e., Connector terminal for transmission) may be disposed on one surface of the substrate 3, and the connector terminals corresponding to the reception wiring lines 53 and 54 (i.e., Connector terminal for reception) may be disposed on the other surface of the substrate 3.

Figure 9:
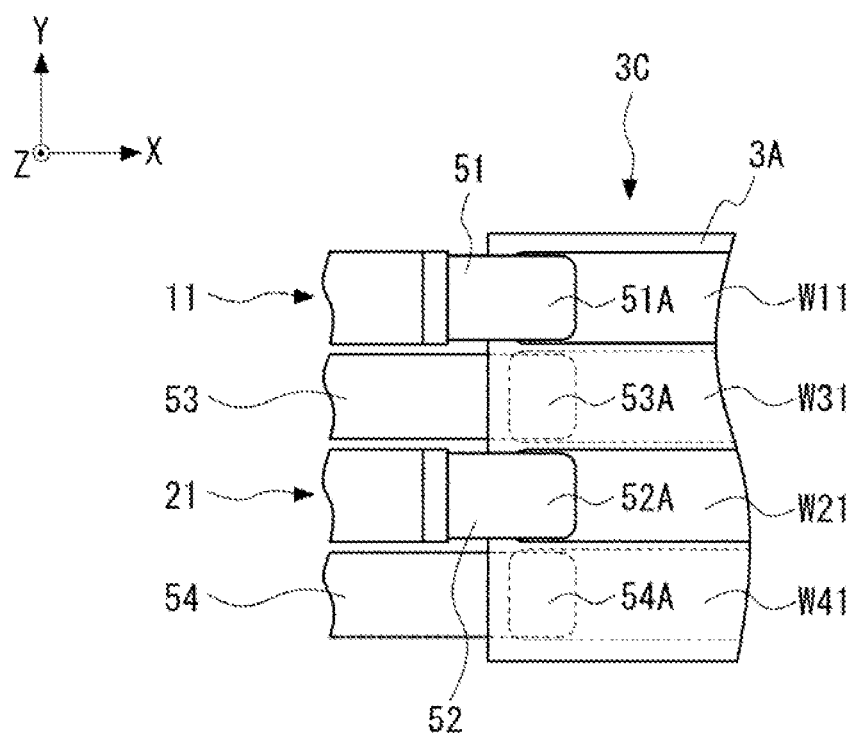
FIG. 9 is a partial top view of the connection part between the transmission wiring line and the reception wiring line, and the substrate.

Next, the connection between the transmission wiring line and the reception wiring line, and the substrate 3 will be described. FIG. 9 is a partial top view of a connection part between the transmission wiring line and the reception wiring line, and the substrate 3. An end 51A of the transmission wiring line 51 and an end 52A of the transmission wiring line 52 are disposed on the upper surface 3A of an end 3C of the substrate 3 separately from each other in the Y-direction. On the other hand, an end 53A of the reception wiring line 53 and an end 54A of the reception wiring line 54 are arranged on the lower surface 3B of the end 3C of the substrate 3 separately from each other in the Y-direction. In the present example embodiment, the transmission wiring line and the reception wiring line are arranged so that the principal plane is parallel to the Y-direction.

However, the end 51A of the transmission line 51 and the end 52A of the transmission wiring line 52 are shifted in the Y-direction with respect to the end 53A of the reception wiring line 53 and the end 54A of the reception wiring line 54. In other words, when viewed along the Z-direction, the end 51A of the transmission wiring line 51, the end 53A of the reception wiring line 53, the end 52A of the transmission wiring line 52, and the end 54A of the reception wiring line 54 are sequentially aligned in the Y-direction.

Therefore, when viewed along the Y-direction, the transmission wiring lines and the reception wiring lines are not interfered, and can be efficiently mounted side by side in the Y-direction. This is advantageous in realizing the miniaturization of the optical transceiver 100.

When viewed along the Z-direction, a wiring line part 51B of the transmission wiring line 51 extends along the X-direction without bending and reaches the end 51A. Similarly, a wiring line part 52B of the transmission wiring line 52, a wiring line part 53B of the reception wiring line 53, and a wiring line part 54B of the reception wiring line 54 extend along the X-direction without bending and reach the ends 52A, 53A, and 54A, respectively. As a result, the lengths of the transmission wiring lines and the reception wiring lines can be minimized, which is advantageous in realizing high-speed transmission required for the optical transceiver 100.

As described above, according to the present configuration, it is possible to transmit signals related to the transmission and reception of the optical signals between the optical transmission apparatus and the BOSA through the substrate 3 and the signal processing circuits 31 and 32. In other words, the transmission of the signal related to the transmission and reception of the optical signal between the optical transmission apparatus and the BOSA can be performed without transferring or diverting the signal to a substrate such as the substrate 4 other than the substrate 3. Thus, it is possible to shorten the transmission distance of the signal related to the transmission and reception of the optical signal between the optical transmission apparatus and the BOSA and to correspond to the high-speed transmission required for the optical transceiver.

Second Example Embodiment

Figure 10:
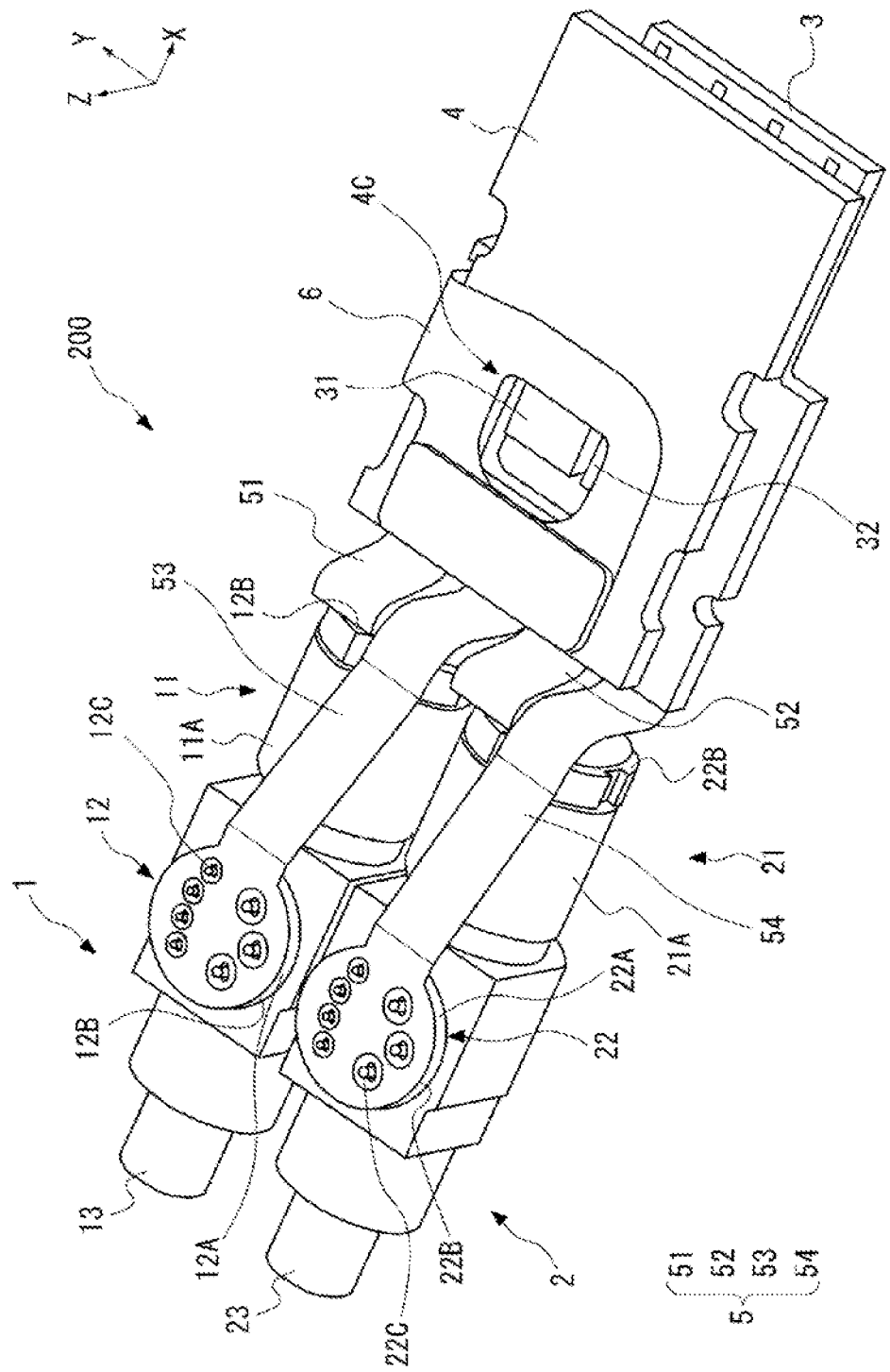
FIG. 10 is a diagram schematically showing a configuration of an optical transceiver according to a second example embodiment.

An optical transceiver 200 according to a second example embodiment will be described. FIG. 10 schematically shows a configuration of the optical transceiver 200 according to the second example embodiment.

The optical transceiver 200 is a modification of the optical transceiver 100, and has a configuration in which a heat radiation hole 4C is disposed in the substrate 4. The heat radiation hole 4C is disposed above a signal processing circuit disposed on the substrate 3. In other words, the heat radiation hole 4C is disposed so that the whole or a part of the signal processing circuit can be seen through the heat radiation hole 4C when viewed from an upper surface 4A side of the substrate 4.

The signal processing circuit is a component having a relatively high load for processing signals for transmission and reception, and generates heat in response to operation. However, since the signal processing circuit is covered with the substrate 4, it is conceivable that heat radiation is reduced. In the present example embodiment, to improve the heat radiation of the signal processing circuit, the heat radiation hole 4C is disposed in the substrate 4. The heat generated in the signal processing circuit reaches the housing 101 through the heat radiation hole 4C by convection and the heat is radiated. When a heat sink in contact with the outer surface of the housing 101 opposed to the heat radiation hole 4C (Z (+)-side surface) is disposed, the heat reaching the housing through the heat radiation hole 4C is quickly radiated from the housing 101 to the heat sink. Thus, the heat radiation effect can be further enhanced.

Therefore, according to the present configuration, the heat generated in the signal processing circuit can be radiated more efficiently than in the optical transceiver 100 having no heat radiation hole 4C. Thus, the temperature of the signal processing circuit can be kept low, and the influence of the heat of the signal processing circuit can be reduced.

Third Example Embodiment

Figure 11:
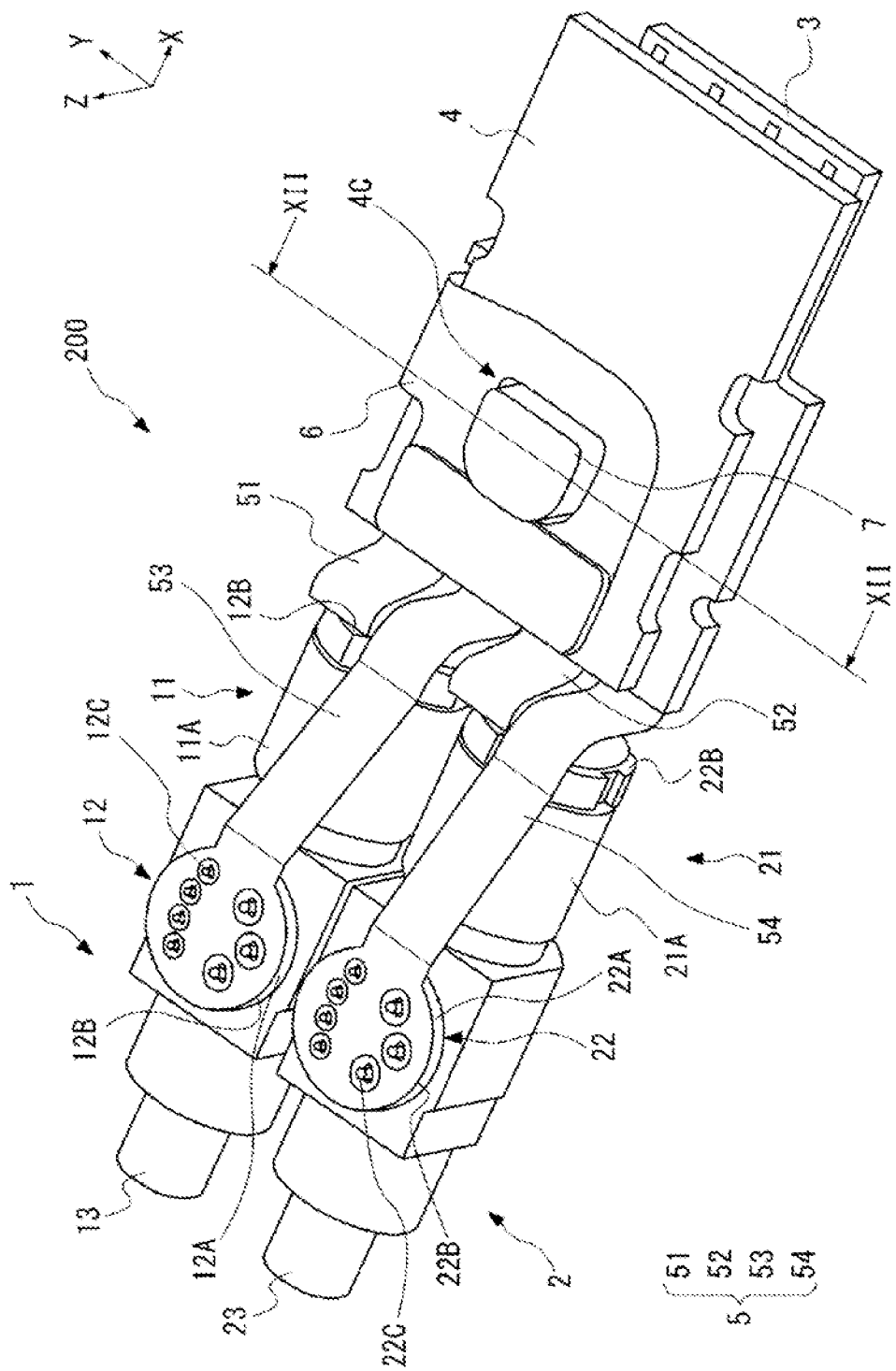
FIG. 11 is a diagram schematically showing a configuration of an optical transceiver according to a third example embodiment.

An optical transceiver 300 according to a third example embodiment will be described. FIG. 11 schematically shows a configuration of the optical transceiver 300 according to the third example embodiment. The optical transceiver 300 is a modification of the optical transceiver 200, and has a configuration in which a heat radiation member 7 inserted into the heat radiation hole 4C is added between the signal processing circuit and the housing 101.

Figure 12:
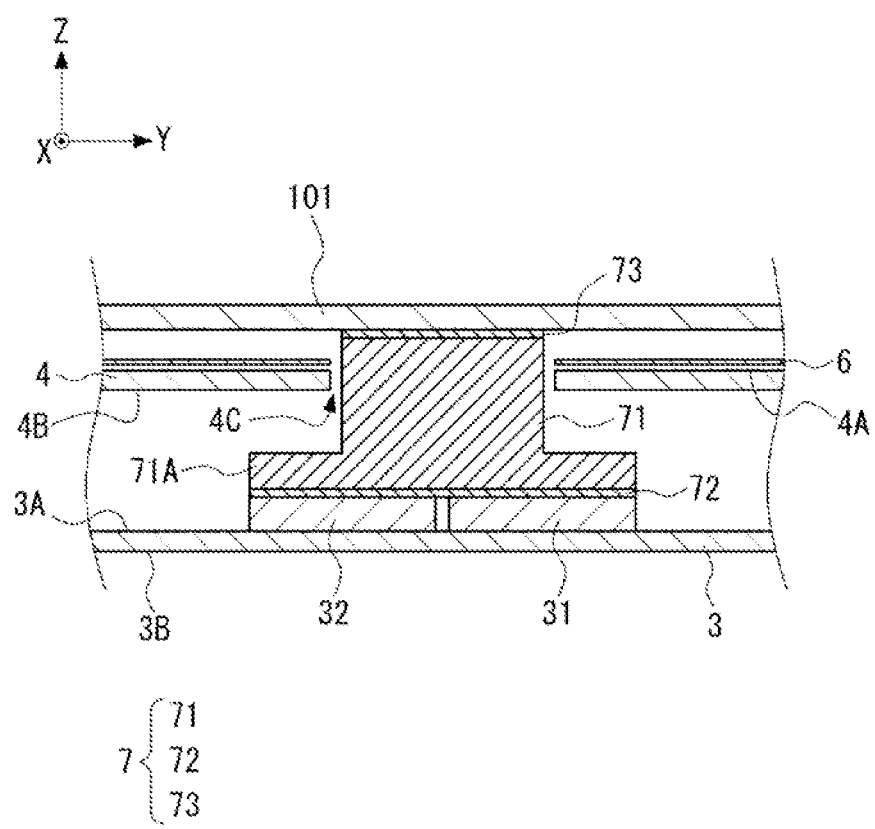
FIG. 12 is a diagram schematically showing a cross-section in the Y-Z plane of the optical transceiver according to the third example embodiment along an XII-XII line of FIG. 12.

FIG. 12 schematically shows a cross-section in the Y-Z plane of the optical transceiver 300 along an XII-XII line of FIG. 11. The heat radiation member 7 inserted into the heat radiation hole 4C is disposed. The heat radiation member 7 includes a heat sink 71. As shown in FIG. 12, the heat radiation member 7 may include heat radiating sheets 72 and 73 in addition to the heat sink 71.

The heat sink 71 is inserted into the heat radiation hole 4C of the substrate 4 and disposes between the upper surfaces of the signal processing circuits 31 and 32, and the housing 101. The heat sink 71 may be configured as a block-like member made of material having high thermal conductivity such as stainless steel and aluminum. Note that the heat sink 71 may directly contact one or both of the signal processing circuit and the housing without the heat radiation sheet interposed therebetween.

In this example, the flexible printed circuit 6 is disposed to cover the heat radiation hole 4C, and a hole through which the heat sink 71 can be inserted is further disposed in the flexible printed circuit 6 as appropriate.

Further, to ensure insulation between the substrate 4 and the heat sink 71, it is desirable that there is a gap between the heat radiation hole 4C and the heat sink 71 when viewed along the Z-direction. In other words, when viewed along the Z-direction, it is desirable that an opening area of the heat radiation hole 4C is larger than the cross-sectional area of the heat sink 71 at the part inserted through the heat radiation hole 4C.

Between the heat sink 71 and the upper surfaces of the signal processing circuits 31 and 32, the heat radiation sheet 72 is inserted. In other words, since the gap between the heat sink 71 and the upper surfaces of the signal processing circuits 31 and 32 is filled with the heat radiation sheet 72, thermal conductivity therebetween is ensured.

Between the heat sink 71 and the housing 101, the heat radiation sheet 73 is inserted. In other words, since the gap between the heat sink 71 and the housing 101 is filled with the heat radiation sheet 73, thermal conductivity therebetween is ensured.

The heat radiation sheets 72 and 73 are preferably made of flexible material having high thermal conductivity. Further, material such as resin to be cured after application or other material such as heat radiation gel may be used instead of one or both of the heat radiation sheets 72 and 73 as long as the heat radiation is ensured.

Further, in the present configuration, the heat sink 71 may be configured in such a manner that a lower surface area on a side of the signal processing circuits 31 and 32 (X-Y plane) is larger than an upper surface area on a side of the housing 101 (X-Y plane). In this example, the heat sink 71 has a flange 71A whose lower surface (X-Y plane) side of the signal processing circuit side projects in the Y-direction, and therefore has a shape in which "T" is inverted.

Thus, the contact area between the signal processing circuits and the heat radiation member 7 can be increased, and the heat generated in the signal processing circuits 31 and 32 can be efficiently conducted to the heat sink 71. In addition, since the dimension of the part of the heat sink 71 inserted into the heat radiation hole 4C in the X-Y plane can be reduced, the area of the heat radiation hole 4C can be also reduced. As a result, the area where components and wiring line can be mounted on the substrate 4 can be increased by reducing the heat radiation hole 4C.

s described above, according to the present configuration, as compared with the optical transceiver 200, the heat radiation of the signal processing circuits 31 and 32 can be further improved. Further, as compared with the optical transceiver 200, the components and wiring line disposed on the substrate 4 can be increased.

Fourth Example Embodiment

Figure 13:
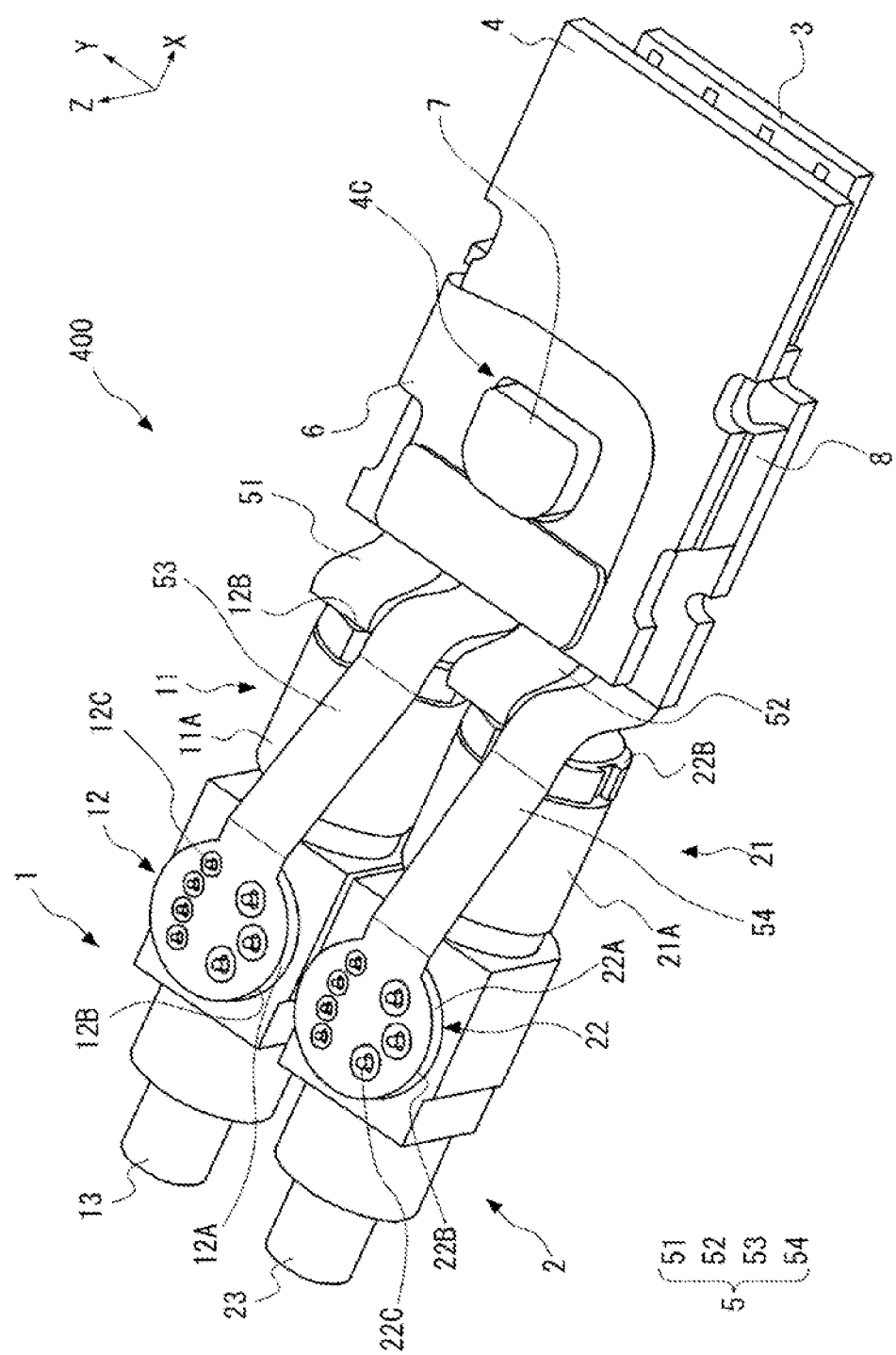
FIG. 13 is a diagram schematically showing a configuration of an optical transceiver according to a fourth example embodiment.

An optical transceiver 400 according to a fourth example embodiment will be described. FIG. 13 schematically shows a configuration of the optical transceiver 400 according to the fourth example embodiment. The optical transceiver 400 is a modification of the optical transceiver 300, and has a configuration in which a spacer 8 is added between the substrate 3 and the substrate 4.

Figure 14:
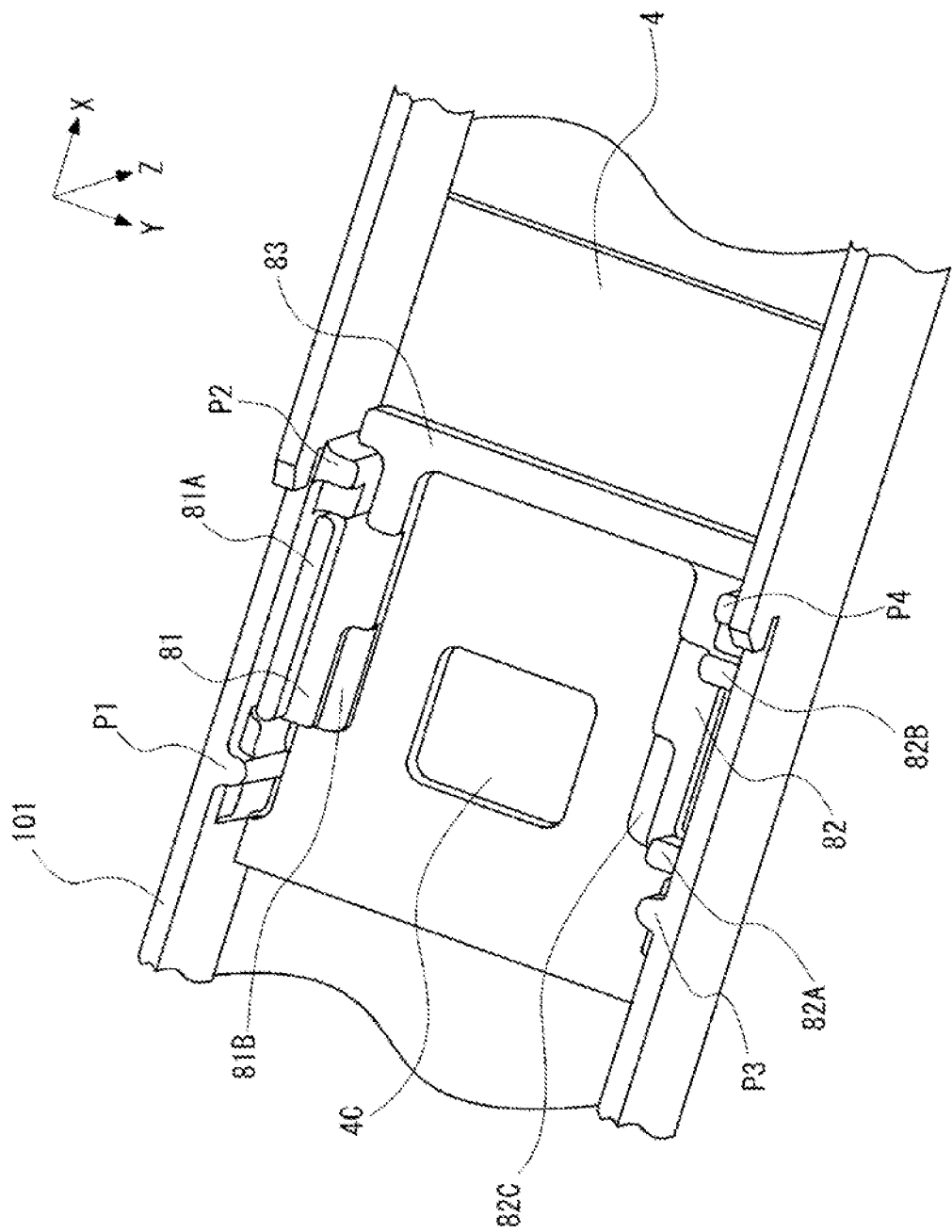
FIG. 14 is a diagram schematically showing an arrangement of the housing, the substrate, and a spacer.
Figure 15:
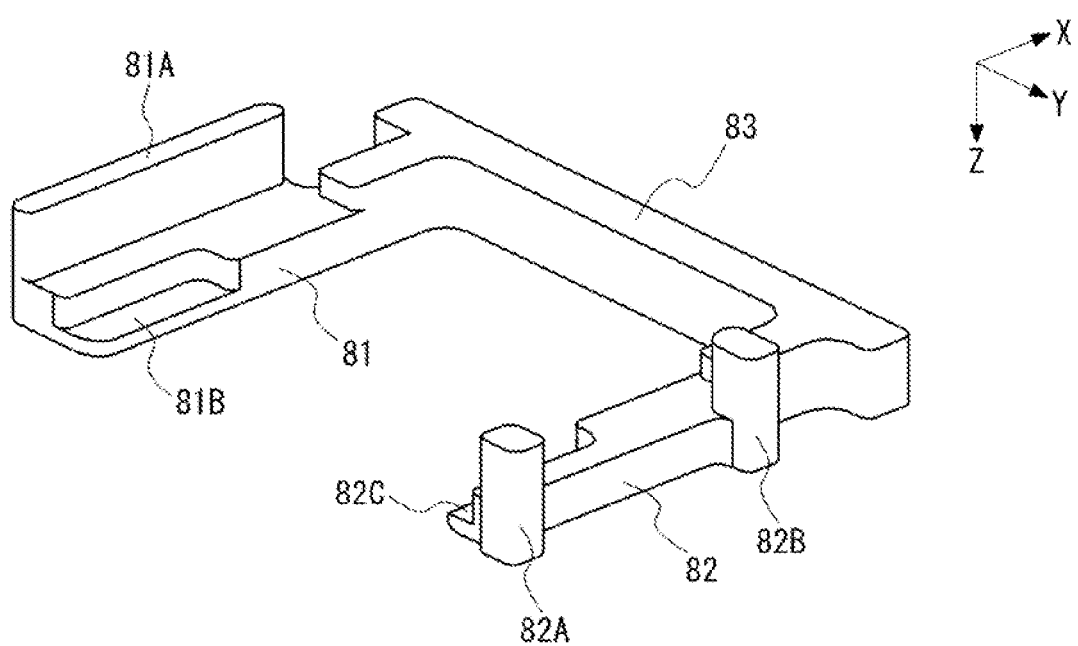
FIG. 15 is a diagram schematically showing a configuration of the spacer.

FIG. 14 schematically shows the arrangement of the housing 101, the substrate 4, and the spacer 8. FIG. 14 shows a case in which the spacer 8 is viewed from the Z (−)-side, and the substrate 3 is omitted to make the spacer 8 easy to see. FIG. 15 schematically shows a configuration of the spacer 8.

In the present example embodiment, the spacer 8 includes frames 81 and 82 that are positioned by fitting to projections disposed in the housing 101, and beam 83 for connecting the frames.

The frame 81 is configured as a member that contacts the substrate 4 and the projection on the inner surface of the housing 101 in the Y (−)-direction, and extends in the X-direction. The frame 81 has a shape to be fitted to projections P1 and P2 projecting in the Y (+)-direction disposed in the housing 101, and thereby the position with respect to the housing 101 is fixed.

The frame 82 is configured as a member that contacts the substrate 4 and the inner surface of the housing 101 in the Y (+)-direction, and extends in the X-direction. The frame 82 has a shape to be fitted to projections P3 and P4 projecting in the Y (−)-direction disposed in the housing 101, and thereby the position with respect to the housing 101 is fixed.

The beam 83 is configured as a member that contacts the substrate 4 and extends in the Y-direction to connect an X (+)-side end of the frame 81 to an X(+)-side end of the frame 82.

Figure 16:
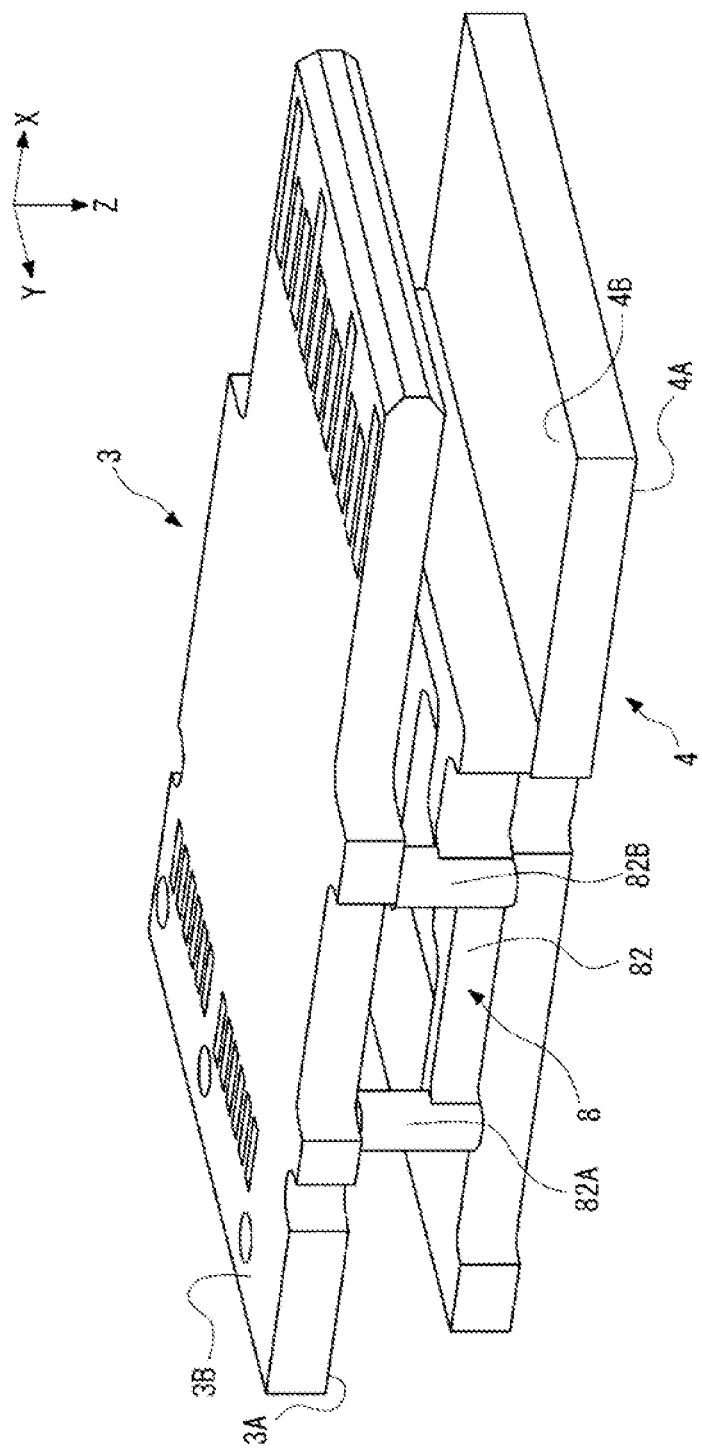
FIG. 16 is a diagram schematically showing the mounting of the substrates and the spacer.

FIG. 16 schematically shows the mounting of the substrate 3, the substrate 4, and the spacer 8. As shown in FIGS. 14 and 15, a column 81A that extends in the X-direction and projects in the Z (−)-direction is disposed on the frame 81. Columns 82A and 82B projecting in the Z (−)-direction are disposed on the frame 82 separately from each other in the X-direction. Thus, as shown in FIG. 16, the columns 81A, 82A, and 82B support the substrate 3, so that the relative distance between the substrate 3 and the substrate 4 is maintained. The spacer 8 is preferably made of insulating material to ensure insulation between the substrate 3 and the substrate 4.

Figure 17:
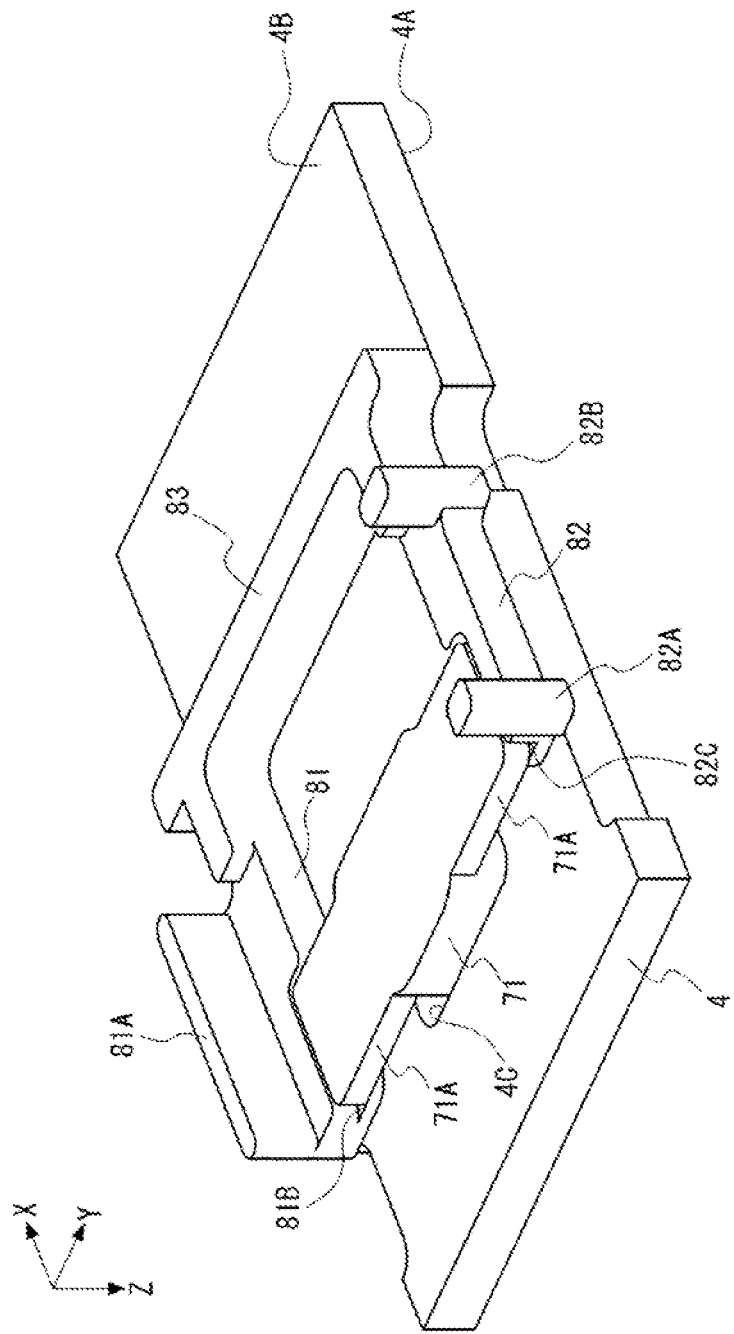
FIG. 17 illustrates the fitting between the spacer and a heat sink.

A recess 81B is formed on the frame 81, and A recess 82C is formed on the frame 82. The recess 81B and the recess 82C are disposed at positions facing each other in the Y-direction. The recesses 81B and 82C are fitted with the flange 71A of the heat sink 71. FIG. 17 shows the fitting between the spacer 8 and the heat sink 71. As shown in FIG. 17, by fitting the flange 71A of the heat sink 71 to the recesses 81B and 82C, the position of the heat sink 71 with respect to the substrates 3 and 4, and the spacer 8 is determined.

Thus, with respect to the signal processing circuits 31 and 32 to be cooled, the heat sink 71 can be easily mounted at an appropriate position. Since the heat sink 71 is fitted to the spacer, the recess made of the insulating material is interposed between the heat sink 71 and the substrate 3 when viewed along the Z-direction. Thereby, direct contact between the substrate 3 and the heat sink 71 can be prevented, and insulation between the substrate 3 and the heat sink 71 can be easily ensured.

The optical transceiver 400 according to the present example embodiment can be manufactured by disposing the substrate 4, the spacer 8, the heat radiation member 7, and the substrate 3 in this order inside the housing 102. Thus, the positional relationship among the substrate 4, the spacer 8, the heat radiation member 7, and the substrate 3 is fixed by a relatively simple assembly operation, and the optical transceiver can be easily manufactured by ensuring the insulation between the substrates and the heat radiation of the signal processing circuit.

Other Embodiments

The present invention is not limited to the above-described example embodiments, and can be modified as appropriate without departing from the scope of the invention. For example, although it has been described that the BOSA includes the transmission unit and the reception unit in the above-described example embodiments, positions of the transmission unit and the reception unit may be appropriately changed into each other in the BOSA. However, in consideration of the quality of the optical signal output from the BOSA, it is desirable that the transmission wiring line is shorter than the reception wiring line as in the cases of the above-described example embodiment.

In the above-described example embodiment, the heat sink 71 is merely an example, and other configurations capable of radiating the heat generated by the signal processing circuits 31 and 32 may be appropriately applied.

Although the example in which the two signal processing circuits 31 and 32 are disposed on the substrate 3 has been described in the above-described example embodiment, the signal processing circuits 31 and 32 may be integrated into one signal processing circuit.

In the above-described example embodiment, although the spacer 8 includes the beam 83, as long as the position of the spacer 8 can be fixed, a spacer without the beam may be used. For example, if the frames 81 and 82 of the spacer 8 are fitted into the housing 101 to fix the position in the Y-direction, the position of the spacer can be fixed without disposing the beam. Further, the configuration of the spacer described here is merely an example, and it should be appreciated that other configurations may be appropriately adopted as long as the positions of the substrate 3, the substrate 4, and the heat sink 71 can be fixed.

While the present invention has been described above with reference to example embodiments, the present invention is not limited to the example embodiments stated above.

(Supplementary note 1) An optical transceiver including: a first optical transmission/reception module; a second optical transmission/reception module; a first substrate including an electric connector connected to an optical transmission apparatus and a signal processing circuit configured to process electric signals input to and output from the first and second optical transceiver modules; a second substrate on which a component outputting a control signal to the signal processing circuit is mounted; and a flexible printed circuit configured to connect the first substrate to the first and second optical transceiver modules.

(Supplementary note 2) The optical transceiver according to Supplementary note 1, in which the first optical transmission/reception module includes: a first transmission unit configured to transmit an optical signal, an axis of the first transmission unit being along a first direction; and a first reception unit configured to receive an optical signal, an axis of the first reception unit being along a second direction orthogonal to the first direction, and the second optical transmission/reception module includes: a second transmission unit configured to transmit an optical signal, an axis of the second transmission unit being along the first direction; and a second reception unit configured to receive an optical signal, an axis of the second reception unit being along the second direction, and principal planes of the first and second substrates are planes parallel to the first direction and a third direction orthogonal to the second direction.

(Supplementary note 3) The optical transceiver according to Supplementary note 2, in which a housing configured to house the first and second optical transceiver modules, the first and second substrates, and the flexible printed circuit, a longitudinal direction of the housing is the first direction.

(Supplementary note 4) The optical transceiver according to Supplementary note 3, in which the first and second reception units include projections projecting in the second direction toward the housing, and a housing part configured to house the projections without contacting the projections is disposed in the housing.

(Supplementary note 5) The optical transceiver according to Supplementary note 4 in which the housing part is configured as a recess disposed in the housing at a position opposed to the projection.

(Supplementary note 6) The optical transceiver according to any one of Supplementary notes 3 to 5, in which the first substrate and the second substrate are stacked in the second direction, and in the second substrate, a heat radiation hole radiating heat generated in the signal processing circuit to the housing is formed at a position opposed to the signal processing circuit disposed in the first substrate.

(Supplementary note 7) The optical transceiver according to Supplementary note 6, further including a heat radiation member disposed between the signal processing circuit and an inner surface of the housing, and extending in the second direction.

(Supplementary note 8) The optical transceiver according to Supplementary note 7, in which the heat radiation member is inserted into the heat radiation hole.

(Supplementary note 9) The optical transceiver according to Supplementary note 8, in which a gap is disposed between the heat radiating hole and the heat radiation member.

(Supplementary note 10) The optical transceiver according to any one of Supplementary notes 7 to 9, further including a spacer inserted between the first substrate and the second substrate to determine positions of the first and second substrates with respect to the housing.

(Supplementary note 11) The optical transceiver according to Supplementary note 10, in which a flange projecting in a direction orthogonal to the second direction is disposed at an end of the heat radiation member on a side of the signal processing circuit, and a recess fitted to the flange to determine a position of the heat radiation member with respect to the first substrate.

(Supplementary note 12) An optical transceiver according to any one of Supplementary notes 2 to 11, in which The flexible printed circuit includes: first and second transmission wiring lines respectively connecting the first and second transmission units to the first substrate; and first and second reception wiring lines respectively connecting the first and second reception units to the first substrate, and the first and second transmission wiring lines and the first and second reception wiring lines extend in the first direction and are disposed side by side in the third direction without overlapping.

(Supplementary note 13) The optical transceiver of Supplementary note 12, in which the first and second transmission wiring lines are connected to wiring lines disposed on a first surface of the first substrate, and the first and second reception wiring lines are connected to wiring lines disposed on a second surface of the first substrate opposed to the first surface.

(Supplementary note 14) The optical transceiver according to Supplementary note 13, in which the first and second transmission wiring lines and the first and second reception wiring lines are connected to the first substrate at positions that do not overlap in the third direction.

(Supplementary note 15) The optical transceiver according to Supplementary note 14, in which the first transmission wiring line, the first reception wiring line, the second transmission wiring line, and the second reception wiring line are connected to the first substrate in this order at the positions that do not overlap in the third direction.

(Supplementary note 16) The optical transceiver according to any one of Supplementary notes 13 to 15, in which first and second terminals disposed on the first surface, and third and fourth terminals disposed on the second surface are disposed in the electric connector, and a signal is transmitted between the first transmission wiring line and the first terminal, between the first reception wiring line and the second terminal, between the second transmission wiring line and the third terminal, and between the second reception wiring line and the fourth terminal through the signal processing circuit.

(Supplementary note 17) The optical transceiver according to Supplementary notes 16, in which a signal transmission path between the first transmission wiring line and the first terminal includes: a wiring line disposed on the first surface and connecting the first transmission wiring line and the signal processing circuit; and a wiring line disposed on the first surface and connecting the signal processing circuit and the first terminal, a signal transmission path between the second transmission wiring line and the third terminal includes: a wiring line disposed on the first surface and connecting the second transmission wiring line and the signal processing circuit; a first via hole penetrating the first substrate; a wiring line disposed on the first surface, one end of which is connected to the signal processing circuit and the other end of which is connected to one end of the first via hole; and a wiring line disposed on the second surface, one end of which is connected to the third terminal and the other end of which is connected to the other end of the first via hole, a signal transmission path between the first reception wiring line and the second terminal includes: a second via hole penetrating the first substrate; a wiring line disposed on the second surface, one end of which is connected to the first reception wiring line and the other end of which is connected to one end of the second via hole; a wiring line disposed on the first surface, one end of which is connected to the signal processing circuit and the other end of which is connected to the other end of the second via hole; and a wiring line disposed on the first surface for connecting the signal processing circuit and the second terminal, and a signal transmission path between the second reception wiring line and the fourth terminal includes: third and fourth via holes penetrating the first substrate; a wiring line disposed on the second surface, one end of which is connected to the second reception wiring line and the other end of which is connected to one end of the third via hole; a wiring line disposed on the first surface, one end of which is connected to the signal processing circuit and the other end of which is connected to the other end of the third via hole; a wiring line disposed on the first surface, one end of which is connected to the signal processing circuit and the other end of which is connected to one end of the fourth via hole; and a wiring line disposed on the second surface, one end of which is connected to the fourth terminal and the other end of which is connected to the other end of the fourth via hole.

The present invention has been described above with reference to the example embodiments, but the present invention is not limited to the above example embodiments. The configuration and details of the present invention can be modified in various ways which can be understood by those skilled in the art within the scope of the invention.

This application is based upon and claims the benefit of priority from Japanese patent application No. 2018-213166, filed on Nov. 13, 2018, the disclosure of which is incorporated herein in its entirety by reference.

REFERENCE SIGNS LIST 1, 2 BOSAS
3, 4 SUBSTRATES
5, 6 FLEXIBLE PRINTED CIRCUITS
7 HEAT RADIATION MEMBER
8 SPACERS
11, 21 TRANSMISSION UNITS
12, 22 RECEPTION UNITS
13, 23 CONNECTOR UNITS
51, 52 TRANSMISSION WIRING LINES
53, 54 RECEPTION WIRING LINES
71 HEAT SINKS
71A FLANGE
72, 73 HEAT RADIATION SHEETS
81, 82 FRAMES
81A, 82A, 82B COLUMNS
81B, 82C RECESSES
83 BEAMS
100, 200, 300, 400 OPTICAL TRANSCEIVERS
101 HOUSING
31, 32 SIGNAL PROCESSING CIRCUITS
P1 TO P4 PROJECTIONS
T1 TO T4 CONNECTOR TERMINALS
V21, V31, V41, V42 VIA HOLES
W11, W12, W21 TO W23, W31 TO W33, W41 TO W44 WIRING LINES

What is claimed is:
1. An optical transceiver comprising:
a first optical transmission/reception module;
a second optical transmission/reception module;
a first substrate comprising an electric connector connected to an optical transmission apparatus and a signal processing circuit configured to process electric signals input to and output from the first and second optical transmission/reception modules;
a second substrate on which a component outputting a control signal to the signal processing circuit is mounted; and
a flexible printed circuit configured to connect the first substrate to the first and second optical transmission/reception modules, wherein
the first optical transmission/reception module comprises:
  a first optical signal transmitter having an axis along a first direction; and
  a first optical signal receiver having an axis along a second direction orthogonal to the first direction, and
the second optical transmission/reception module comprises:
  a second optical signal transmitter having an axis along the first direction; and
  a second optical signal receiver having an axis along the second direction, and
principal planes of the first and second substrates are planes parallel to the first direction and a third direction orthogonal to the second direction.
2. The optical transceiver according to claim 1, further comprising a housing configured to house the first and second optical transmission/reception-modules, the first and second substrates, and the flexible printed circuit, wherein a longitudinal direction of the housing is in the first direction.

3. The optical transceiver according to claim 2, wherein
the first and second optical signal receivers include projections projecting in the second direction toward the housing, and
a housing part configured to house the projections without contacting the projections is disposed in the housing.

4. The optical transceiver according to claim 3, wherein the housing part is configured as a recess disposed in the housing at a position opposed to the projection.

5. The optical transceiver according to claim 2, wherein
the first substrate and the second substrate are stacked in the second direction, and
in the second substrate, a heat radiation hole radiating heat generated in the signal processing circuit to the housing is formed at a position opposed to the signal processing circuit disposed in the first substrate.

6. The optical transceiver according to claim 5, further comprising a heat radiation member disposed between the signal processing circuit and an inner surface of the housing, and extending in the second direction.

7. The optical transceiver according to claim 6, wherein the heat radiation member is inserted into the heat radiating hole.

8. The optical transceiver according to claim 7, wherein a gap is disposed between the heat radiating hole and the heat radiation member.

9. The optical transceiver according to claim 6, further comprising a spacer inserted between the first substrate and the second substrate to determine positions of the first and second substrates with respect to the housing.

10. The optical transceiver according to claim 9, wherein
a flange projecting in a direction orthogonal to the second direction is disposed at an end of the heat radiation member on a side of the signal processing circuit, and
a recess fitted to the flange to determine a position of the heat radiation member with respect to the first substrate.

11. The optical transceiver according to claim 1, wherein the flexible printed circuit comprises:
first and second transmission wiring lines respectively connecting the first and second optical signal transmitters to the first substrate; and
first and second reception wiring lines respectively connecting the first and second receivers to the first substrate, and
the first and second transmission wiring lines and the first and second reception wiring lines extend in the first direction and are disposed side by side in the third direction without overlapping.

12. The optical transceiver according to claim 11, wherein
the first and second transmission wiring lines are connected to wiring lines disposed on a first surface of the first substrate, and
the first and second reception wiring lines are connected to wiring lines disposed on a second surface of the first substrate opposed to the first surface.

13. The optical transceiver according to claim 12, wherein the first and second transmission wiring lines and the first and second reception wiring lines are connected to the first substrate at positions that do not overlap in the third direction.

14. The optical transceiver according to claim 13, wherein the first transmission wiring line, the first reception wiring line, the second transmission wiring line, and the second reception wiring line are connected to the first substrate in this order at the positions that do not overlap in the third direction.

15. The optical transceiver according to claim 12, wherein
first and second terminals disposed on the first surface, and third and fourth terminals disposed on the second surface are disposed in the electric connector, and
a signal is transmitted between the first transmission wiring line and the first terminal, between the first reception wiring line and the second terminal, between the second transmission wiring line and the third terminal, and between the second reception wiring line and the fourth terminal through the signal processing circuit.

16. The optical transceiver according to claim 15, wherein
a signal transmission path between the first transmission wiring line and the first terminal comprises:
a wiring line disposed on the first surface and connecting the first transmission wiring line and the signal processing circuit; and
a wiring line disposed on the first surface and connecting the signal processing circuit and the first terminal,
a signal transmission path between the second transmission wiring line and the third terminal comprises:
a wiring line disposed on the first surface and connecting the second transmission wiring line and the signal processing circuit;
a first via hole penetrating the first substrate;
a wiring line disposed on the first surface, a first end of which is connected to the signal processing circuit and a second end of which is connected to a first end of the first via hole; and
a wiring line disposed on the second surface, a first end of which is connected to the third terminal and a second end of which is connected to a second end of the first via hole,
a signal transmission path between the first reception wiring line and the second terminal comprises:
a second via hole penetrating the first substrate;
a wiring line disposed on the second surface, a first end of which is connected to the first reception wiring line and a second end of which is connected to a first end of the second via hole;
a wiring line disposed on the first surface, a first end of which is connected to the signal processing circuit and a second end of which is connected to a second end of the second via hole; and
a wiring line disposed on the first surface for connecting the signal processing circuit and the second terminal, and
a signal transmission path between the second reception wiring line and the fourth terminal comprises:
third and fourth via holes penetrating the first substrate;
a wiring line disposed on the second surface, a first end of which is connected to the second reception wiring line and a second end of which is connected to a first end of the third via hole;
a wiring line disposed on the first surface, a first end of which is connected to the signal processing circuit and a second end of which is connected to a second end of the third via hole;
a wiring line disposed on the first surface, a first end of which is connected to the signal processing circuit and a second end of which is connected to a first end of the fourth via hole; and
a wiring line disposed on the second surface, a first end of which is connected to the fourth terminal and a second end of which is connected to a second end of the fourth via hole.

* * * * *